(12) United States Patent  (10) Patent No.: US 7,867,887 B2
Melville et al.  (45) Date of Patent: Jan. 11, 2011

(54) STRUCTURE AND METHOD FOR ENHANCING RESISTANCE TO FRACTURE OF BONDING PADS

(75) Inventors: Ian D. Melville, Highland, NY (US); Mukta G. Farooq, Hopewell Junction, NY (US); Dae Young Jung, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 352 days.

(21) Appl. No.: 12/174,074

(22) Filed: Jul. 16, 2008

(65) Prior Publication Data

US 2008/0274608 A1 Nov. 6, 2008

Related U.S. Application Data

(62) Division of application No. 11/559,130, filed on Nov. 13, 2006, now Pat. No. 7,573,115.

(51) Int. Cl.
*H01L 21/768* (2006.01)
(52) U.S. Cl. ................................ 438/612; 257/E21.575
(58) Field of Classification Search .......... 257/E21.627, 257/E21.641, E21.575, E23.02; 438/637, 438/629
See application file for complete search history.

(56) References Cited

U.S. PATENT DOCUMENTS

| | | |
|---|---|---|
| 5,149,674 A | 9/1992 | Freeman, Jr. et al. |
| 5,403,777 A | 4/1995 | Bryant et al. |
| 5,502,337 A | 3/1996 | Nozaki |
| 5,700,735 A | 12/1997 | Shiue et al. |
| 5,736,791 A | 4/1998 | Fujiki et al. |
| 5,739,587 A | 4/1998 | Sato |
| 6,187,418 B1 | 2/2001 | Fasano et al. |
| 6,313,537 B1 | 11/2001 | Lee et al. |
| 6,365,970 B1 | 4/2002 | Tsai et al. |
| 6,524,942 B2 | 2/2003 | Tsai et al. |
| 6,720,658 B2 * | 4/2004 | Anand ........................ 257/758 |
| 6,762,495 B1 | 7/2004 | Reyes et al. |
| 6,818,540 B2 | 11/2004 | Saran et al. |
| 6,900,395 B2 | 5/2005 | Jozwiak et al. |
| 6,987,316 B2 | 1/2006 | Reddy et al. |
| 7,741,207 B2 * | 6/2010 | Hashimoto et al. .......... 438/614 |
| 2002/0000668 A1 | 1/2002 | Sakihama et al. |
| 2002/0179991 A1 | 12/2002 | Varrot et al. |
| 2004/0016949 A1 | 1/2004 | Semi |

OTHER PUBLICATIONS

Wakharkar et al., "Materials Technologies for Thermomechanical Management of Organic Packages", Intel Technology Journal, Nov. 9, 2005, pp. 309-324, col. 09, Issue 04.

* cited by examiner

*Primary Examiner*—Thao P. Le
(74) *Attorney, Agent, or Firm*—Scully, Scott, Murphy & Presser, P.C.; Wenjile Li

(57) ABSTRACT

The present invention provides bond pads structures between semiconductor integrated circuits and the chip package with enhanced resistance to fracture and improved reliability. Mismatch in the coefficient of temperature expansion (CTE) among the materials used in bond structures induces stress and shear on them that may result in fractures within the back end dielectric stacks and cause reliability problems of the packaging. By placing multiple metal pads which are connected to the bond pad through multiple metal via, the adhesion between the bond pads and the back end dielectric stacks is enhanced.

6 Claims, 9 Drawing Sheets

STRUCTURE AND METHOD FOR ENHANCING RESISTANCE TO FRACTURE OF BONDING PADS

RELATED APPLICATIONS

This application is a divisional of U.S. patent application Ser. No. 11/559,130, filed Nov. 13, 2006.

FIELD OF THE INVENTION

The present invention relates to semiconductor structures, and particularly, to bonding pad structures.

BACKGROUND OF THE INVENTION

In the semiconductor industry, a bond pad refers to a contiguous metal pad typically formed out of the last layers of metal during a semiconductor manufacturing sequence. A bond pad is typically large enough to accommodate the bottom portion of a solder ball. A bond pad structure refers to a structure containing such a bond pad and surrounding or attached structure, which as a whole helps accommodate the solder ball.

Once the fabrication of integrated circuit elements on a semiconductor substrate is completed, the semiconductor substrate is diced and packaged in a bonding process. Bond pads provide a structure for electrical connection between the fabricated integrated circuit elements and the package. Typically, one end of an interconnection wire is bonded to a bond pad and the other end is bonded to the next level of integration, which is typically an inner lead of the package. In a typical bonding process, multiple interconnection wires are utilized to connect each of the electrically active pads to one of the inner leads of the package.

A typical bond pad structure contains an exposed large piece of metal on which a bonding wire is attached with a solder ball. During the operation of the chip, the temperature of the chip rises, thereby raising the temperature of the bonding structure including the bonding pad and the solder ball. Due to the differences in the coefficients of thermal expansion (CTE), the bonding structure is subjected to shear and stress. These may cause cracks in the bonding structure causing electrical failure of the bonding pad or slow degradation and reliability problems due to ingress of ambient atmosphere, especially moisture into the chip. Wakharkar et al., "Materials Technologies for Thermomechanical Management of Organic Packages," Vol. 09, Issue 04, November 2005, pp. 309-324" discusses various aspects of reliability due to chip-package interaction (CPI).

Therefore, mechanical strength of the bonding structure that is sufficient to withstand the stress and shear during the operational lifetime of a chip is of utmost importance in the design of a bonding structure. To establish the reliability of a particular bond structure, it is customary in the semiconductor industry to subject the bond structures to rigorous stress routines and measure their failure rate. The standard method of testing the mechanical strength of a bonding structure is known as "JEDEC Standard" and is widely used in the semiconductor industry.

Many designs to enhance the mechanical strength of the bonding structure are known. As an example, U.S. Pat. No. 6,365,970 to Tsai et al.; U.S. Pat. No. 5,739,587 to Sato; and U.S. Pat. No. 5,700,735 to Shiue et al. utilize multiple layers of metals and via plugs. These structures utilize multiple layers of metals connected with via plugs in the bonding pad area to mechanically strengthen the bonding structures. One disadvantage of this approach is the lack of availability of the bonding pad area for wiring purposes. In other words, since multiple metal levels are filled with structures that are part of the bond structure, no other electrical structure such as metal wiring can be built within the same space. Thus, metal wiring is severely limited under the bond pad.

An alternative approach in the prior art that maximizes the available space for wiring under the bond pad is also known. Instead of utilizing multiple layers of metal, only the top level of metal is utilized for the bond pad. An electrical connection from the bond pad to lower metal levels is provided through an extension of the bond pad and vias attached to a lower level metal wire. The area below the bond pad is available for electrical wiring. If electrical wiring is not needed under the bond pad, the area in the lower level under the bond pads may be filled with metal fills to facilitate a chemical mechanical planarization (CMP) process.

It has been discovered during the process of the present invention that the above structure with one level of metal for the bond pads is prone to fracture when subjected to reliability stress. While the structure above provides maximum flexibility for wiring, the mechanical strength of the structure is not sufficient to provide a reliable structure under stress.

Therefore, the need exists to provide a bond pad structure that provides sufficient mechanical strength while still providing as much flexibility in metal wiring under the bond pad structure as possible.

SUMMARY OF THE INVENTION

The present invention addresses the needs described above and provides a bond pad structure with enhanced mechanical strength. Specifically, the present invention aims to increase the mechanical strength of a bond pad structure compared to the prior art that maximizes the available space for wiring under a bond pad.

The present invention also provides as much free space as possible under a bond pad structure to facilitate the ease of design for wiring purposes.

Furthermore, the present invention provides a bond pad structure that facilitates easy manufacture of the structure without excessive burden on process control. Specifically, the present invention seeks to place metal fills as necessary under a bond pad structure to reduce dishing during a chemical mechanical polishing process during the manufacture of the structure.

While this disclosure uses specific materials to describe the invention, it should be recognized that functionally equivalent material may be substituted for any of the material described below.

In accordance with one aspect of the present invention, multiple first metal vias are placed within the "pad area", that is, within the boundaries of a first metal pad, or a bond pad, and adjoined to the bond pad from below. Each of the multiple first metal vias are connected to mutually disjoined multiple metal pads, herein referred to as "multiple metal pads," which are located below the multiple first metal vias. Each of the multiple metal pads are confined within the metal level immediately below the level of the bond pad itself.

In this inventive structure, not only does the bottom surface of the bond pad itself adhere to the insulating layer immediately below, but the walls of the multiple first metal vias and all the surfaces of the multiple metal pads not adjoining the multiple first metal vias also adhere to the dielectrics surrounding them. The area of adhesion between the dielectric material in the back end of the line film stack and the contiguous and conducting extension of the bond pad, including the bond pad itself, the multiple first metal vias, and the multiple metal pads, is increased significantly.

In accordance with another aspect of the present invention, the use of metal wiring in the area within the metal levels below the bond pad is enabled to provide enhanced flexibility in metal wiring. The metal wiring may be utilized to pass current from another part of the semiconductor chip through the area containing the bond pad to yet another part of the semiconductor chip. The area not utilized by the multiple metal pads or by the metal wiring may be filled with metal fills to facilitate the chemical mechanical planarization process during the manufacturing. Alternatively, if the area below the bond pad is not utilized, metal fills only may be utilized to facilitate the CMP process.

While small portions of the multiple pads may actually be located outside the pad area, the multiple metal pads and the multiple first metal vias landing on them are substantially within the pad area to minimize the adverse impact on the wiring. The multiple metal pads may be confined exclusively within the peripheral area, defined as the area within the pad area and along the periphery of the bond pad, or they may be confined exclusively within the center area, defined as the remainder of the center area after excluding the peripheral area. Alternatively, the multiple metal pads may be distributed across the pad area, both within the peripheral area and within the center area.

In accordance with yet another aspect of the present invention, a portion of the pad area within the metal level below the bond pad, wherein the multiple metal pads are located, may be utilized to electrically connect the bond pad to the integrated circuit elements on the chip and to provide enhanced flexibility in metal wiring. The use of additional metal wire connected to the bond pad has the advantage of reducing the resistance of the electrical path from the bond pad, thereby reducing a voltage drop between the bond pad and the integrated circuit elements.

In this case, the unused portion of the pad area within the metal level below the bond pad may also be utilized for a second set of metal wires for passing current from another part of the semiconductor chip through the pad area within the metal level below the bond pad to yet another part of the semiconductor chip. If some unused area still remains in the pad area within the metal level below the bond pad, metal fills may optionally be used to facilitate the CMP process.

According to still another aspect of the present invention, multiple first metal vias are placed within the "pad area", that is, within the boundaries of a first metal pad, or a bond pad, and adjoined to the bond pad from below. Each of the multiple first metal vias are connected to one of mutually disjoined multiple metal stacks, herein referred to as "vertical alternating stacks," wherein third metal pads and second metal vias are alternately adjoined to one another. When two components of a vertical alternating stack are adjoined, they are always adjoined vertically, that is, one on top of another. The top of each of the vertical alternating stack is a third metal pad which adjoins the bottom of at lease one of the multiple first metal vias. All components within each vertical alternating stack are electrically connected to one another.

Not only does the bottom surface of the bond pad itself adhere to the insulating layer immediately below in this structure, but the walls of the multiple first metal vias and surfaces of all the vertical alternating stacks not adjoining the multiple first metal vias also adhere to the dielectrics surrounding them. The area of adhesion between the dielectric material in the back end of the line film stack and the contiguous and conducting extension of the bond pad, including the bond pad itself and the multiple vertical alternating stacks, is increased significantly.

A portion of pad area within the metal level below the bond pad, wherein the multiple metal pads are located, may be utilized to electrically connect the bond pad to the integrated circuit elements on the chip and to provide enhanced flexibility in metal wiring in this structure. Also, the unused portion of the pad area within the metal level below the bond pad may also utilized for a second set of metal wires for passing current from another part of the semiconductor chip through the pad area within the metal level below the bond pad to yet another part of the semiconductor chip. If some unused area still remains in the pad area within the metal level below the bond pad, metal fills may optionally be used to facilitate the CMP process.

The adhesion between the bond structures according to the various aspects of the present invention is superior to prior art structures without any via below a bond pad while the flexibility of wiring is better than prior art structures wherein the bond pad structure occupies multiple levels of metal layers.

DETAILED DESCRIPTION OF THE INVENTION

Before describing the present invention in detail, a discussion of a prior art bond pad structure is provided. The purpose of this discussion is to clearly illustrate the fundamental difference between the prior art and the present invention.

Figure 1:
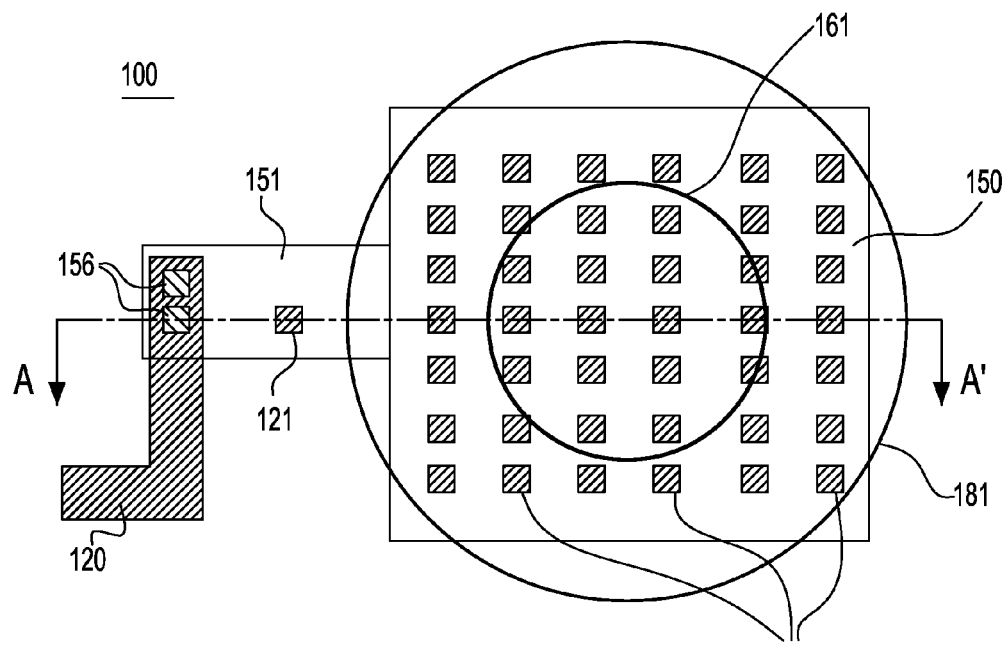
FIG. 1 is a schematic diagram of a top-down view of a bond pad structure according to the prior art.

Referring to FIG. 1, a schematic top-down view of a prior art bond pad structure 100 is provided wherein a bond pad 150, a bond pad extension 151, a portion of a metal wire 120 that is electrically connected to the bond pad 150 and to the bond pad extension 151 through two vias 156 are shown. Also shown are the opening 161 in a passivation layer 160 (not shown in FIG. 1) and in a photosensitive polyimide layer 170 (not shown in FIG. 1) as well as the periphery 181 of a barrier liner material 180 (not shown in FIG. 1). A metal fill 121 within the area of the bond pad extension 151 is shown as well as multiple metal fills 123 within the area of the pad 150, or the "pad area."

Figure 2:
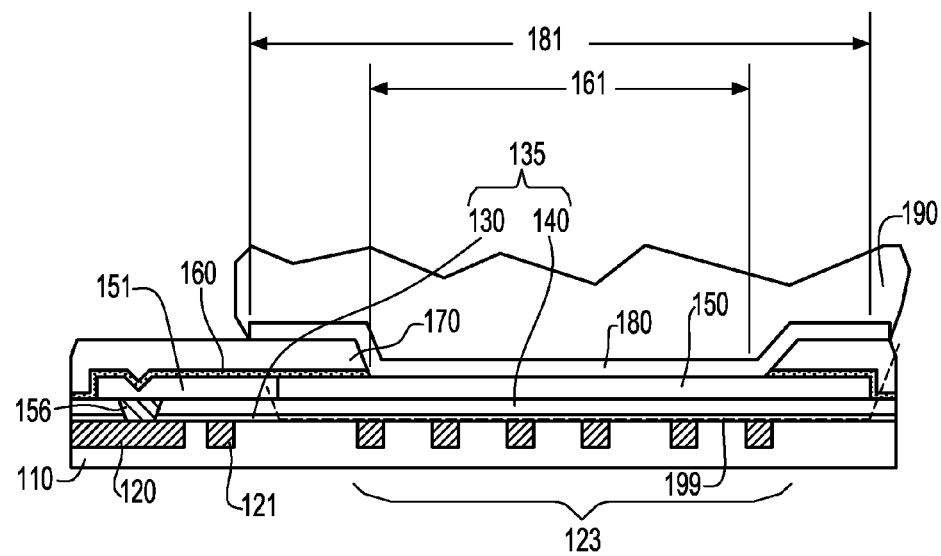
FIG. 2 is a schematic diagram of a cross-sectional view of a bond pad structure in FIG. 1 in the direction A-A'.

FIG. 2 is a schematic cross-sectional view of the prior art bond pad structure 100 along the line labeled A-A' in FIG. 1. A first insulating layer 110, which is the topmost insulating layer from the underlying back end of the line stack, contains the metal wire 120 as well as the metal fill 121 under the bond pad extension 151 and the metal fills 123 contained within the pad area. While additional metal fills are not specifically shown under the bond pad 150, they may be placed in the same level as the metal fill 121 shown in FIG. 2. Disposed on top of the first insulating layer 110 is a second insulating layer 135, which in turn comprises a cap layer 130, and an insulating dielectric layer 140. A bond pad 150 and the bond pad extension 151 are disposed on top of the second insulating layer 135. A via 156, which is filled with metal and electrically connects the bond pad extension 151 and the metal wire 120 insulating layer, is disposed within an opening in the second insulating layer 135 and the cap layer 130. A passivation layer 160 and a photosensitive polyimide layer 170 are disposed over the bond pad 150, the bond pad extension 151, or the second insulation layer 135. The opening 161 in the passivation layer 160 and a photosensitive polyimide layer 170 is also shown. The barrier liner material 180 and its periphery 181 and the solder is disposed over the opening 161. A solder ball 190 is disposed on the barrier liner material 180.

In the course of experiments leading to the present invention, the prior art bond pad structures schematically represented by FIGS. 1-2 were manufactured and placed under reliability stress conditions. Specifically, these samples were subjected to the JEDEC level 3 testing wherein each package formed using a bonding process on the bond pads is subjected to preconditioning and then tested for functionality for the next 168 hours. In other words, certification at JEDEC level 3 testing means that the package can operate for 168 hours after being subjected to preconditioning. The preconditioning method for level 3 JEDEC testing is 192 hours of exposure to 60% relative humidity at 30 degree Celsius.

Figure 3:
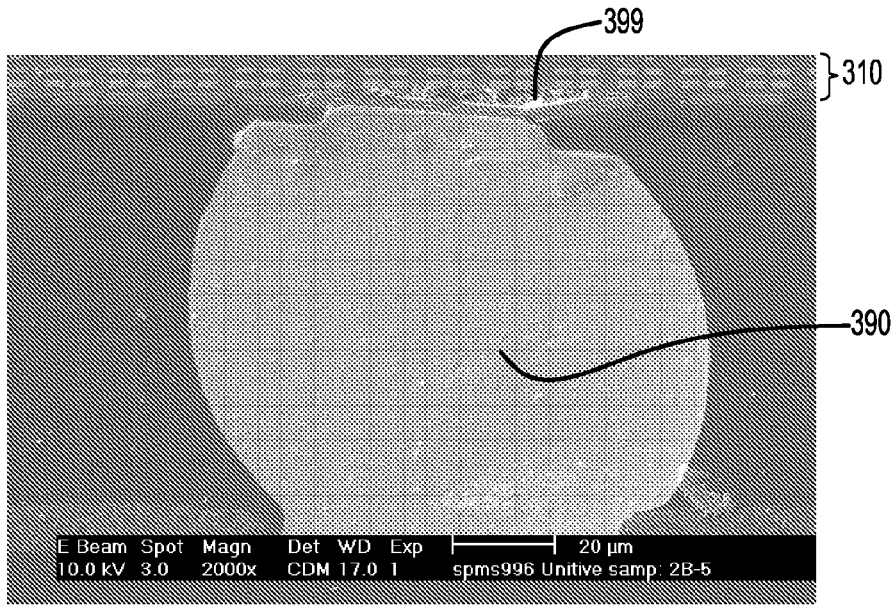
FIG. 3 is a scanning electron micrograph (SEM) of a structure according to the prior art showing a fracture induced during the preconditioning of JEDEC level 3 test.

Some of the samples showed structural fails after the preconditioning stress. FIG. 3 shows a scanning electron micrograph (SEM) 300 of a cross-section of one of the samples that failed after the preconditioning stress. With a rotation of a solder ball 390, or a "C4 ball," due to the shear and stress during the preconditioning, the underlying back end of the line stack 310 separated from the solder ball 390 causing a crack 399 between them. The location of the crack is schematically shown in FIG. 2 as a dotted line 199.

Figure 4:
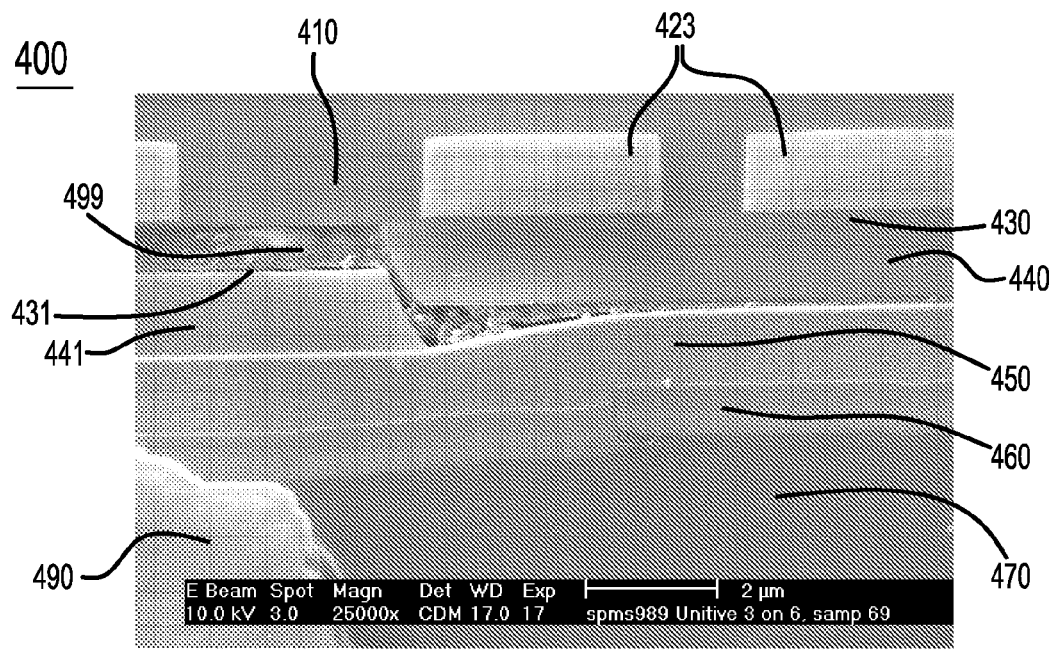
FIG. 4 is a magnified view of the scanning electron micrograph (SEM) in FIG. 3 of the area with the fracture.

FIG. 4 shows a magnified SEM 400 of the SEM 300 shown in FIG. 3, wherein the structures surrounding the crack 499 are shown in more detail. A first insulating layer 410, which is the topmost insulating layer in the back end of the line stack (not fully shown in FIG. 4) and is a TEOS (Tetra Ethyl Orthosilicate; $(C_2H_5O)_4Si$) based FSG (Fluorosilicate Glass) in this SEM, contains metal fills 423 in the pad area. The metal fills 423 are made of copper in this case. One part of a stack, consisting of a portion 430 of a cap layer, which in turn contains an NBLoK (Nitrided Barrier Low K: nitrogen doped silicon carbide ($SiN_xC_yH_z$) as exemplified in U.S. Pat. No. 7,009,280) and a nitride layer, and a portion 440 of a second insulating layer, is attached to the first insulating layer 410 above. Another part of the same stack, consisting of a different portion 431 of the cap layer and a different portion 441 of the second insulating layer, is attached to an aluminum alloy 450 below. A crack 499 between the two parts of the same stack is clearly visible and is located between the first dielectric 410 above and the aluminum alloy 450 below. The aluminum alloy 450 comprises a liner stack and aluminum in this particular case. The liner stack is made of tantalum nitride (TaN), titanium (Ti), and titanium nitride (TiN). Below the aluminum alloy 450 is a passivation layer 460, of which a crack is visible in this SEM 400. The passivation layer 460 is a stack of oxide and nitride in this case. Below the passivation layer 460 is a polyimide layer 470. Part of the solder ball 490 is also seen.

Clearly, the mechanical strength of this structure was not sufficient to prevent the delamination of the bond pad structure from the underlying back end of the line dielectric material during the preconditioning. As shall be seen below, the present invention strengthens the mechanical strength of a bond pad structure to prevent fails as seen in FIGS. 3-4.

Figure 5:
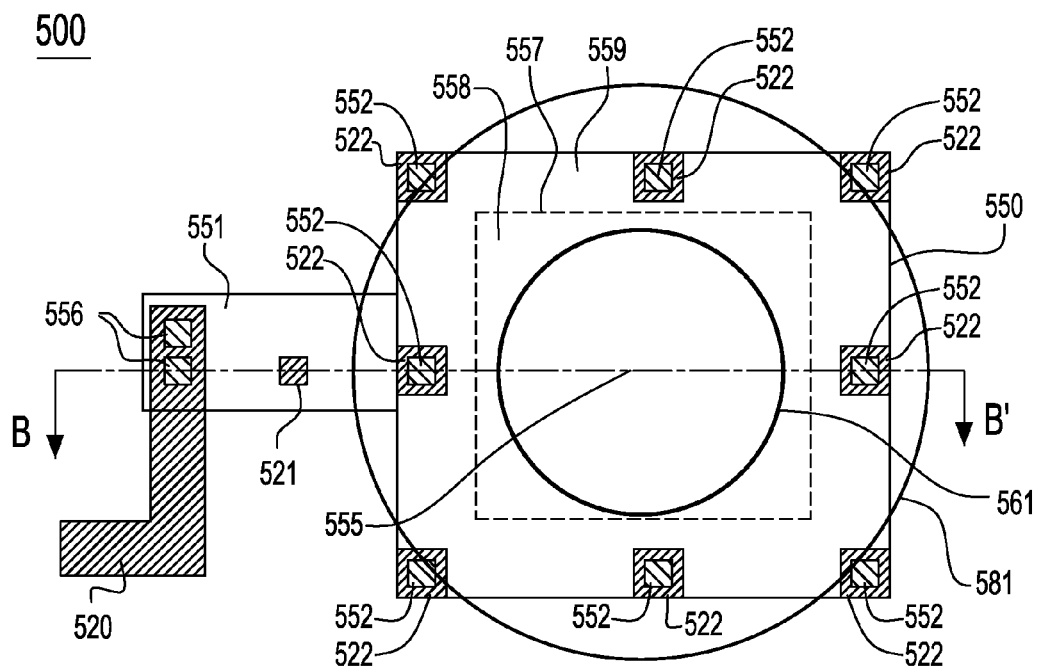
FIG. 5 is a schematic diagram of a top-down view of a bond pad structure according to a first embodiment of the present invention.
Figure 6:
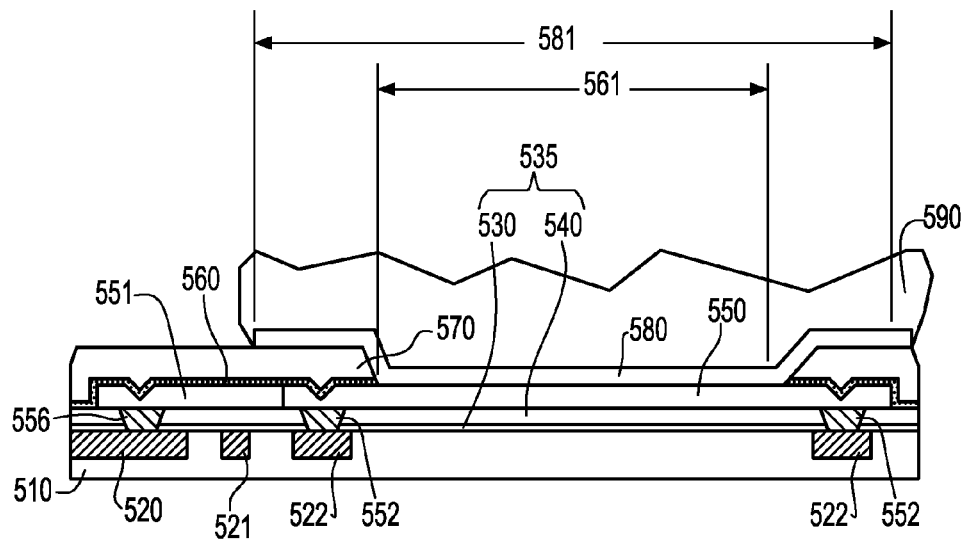
FIG. 6 is a schematic diagram of a cross-sectional view of a bond pad structure in FIG. 5 in the direction B-B'.

According to a first embodiment of the present invention, a first bond pad structure 500 is described in FIGS. 5-6. FIG. 5 is a schematic top-down view, while FIG. 6 is a schematic cross-sectional view along the line B-B' in FIG. 5. The first bond pad structure 500 has a first metal pad 550, which is a bond pad, in the first layer of the structure. The area inside the periphery of the first metal pad 550 is referred to as the "pad area." Only one contiguous first metal pad is necessary for the formation of one of the first bond pad structure 500. The first metal pad 550 is made of metal, and preferably a stack of a liner material and an aluminum alloy. A bond pad extension 551, adjoining the bond pad 550, built on the same level as a bond pad 550, and consisting of the same material as the bond pad, may optionally be constructed as well. The liner material may comprise a stack of tantalum nitride (TaN), titanium (Ti), and titanium nitride (TiN) or an alternate stack of metals with good adhesion property to the underlying dielectric material The first bond pad structure 500 according to the first embodiment of the present invention contains a first insulating layer 535 disposed underneath the first metal pad 550 and extends at least over the entire pad area. The bottom surface of the first metal pad 550 adjoins the top surface of the first insulating layer 535. In FIG. 6, the first insluting layer 535 comprises a stack of an insulating dielectric layer 540 disposed on top of a cap layer 530, both of which are insulators. Preferably, the insulating dielectric layer 540 is chosen from a silicon oxide layer, a silicon nitride layer, and a doped silicon oxide layer such as a fluorosilicate glass (FSG). Preferably, the cap layer 530 is chosen from a BLoK layer (a Barrier Low K layer as exemplified in U.S. Pat. No. 6,632,478), an NBLoK layer, and a silicon nitride layer. Alternatively, the first insulating layer 535 may comprise a single layer of insulating material or even a stack of more than two insulating materials.

The first bond pad structure 500 according to the first embodiment of the present invention contain multiple first metal vias 552 through the first insulating layer 535 and are located within the pad area. The top surface of each of the multiple first metal vias 552 adjoins a portion of the bottom surface of the first metal pad 550, or the bond pad. Optionally, metal vias 556 may be utilized to connect the bond pad extension 551 to a portion of a metal wire 520 below. Preferably, the first metal vias 552 and the first metal pad 550 are aluminum alloys. Most preferably, the first metal vias 552 and the first metal pad 550 are formed at the same time as a stack containing a liner material and aluminum.

The first bond pad structure 500 according to the first embodiment of the present invention contains multiple metal pads 522 disposed underneath the first insulating layer 535, and overlapping at least a portion of the pad area, and not adjoined to one another. The multiple metal pads 522 are located beneath the multiple first metal vias 552 and adjoin the bottom surface of at least one of the multiple first metal vias 552. The multiple metal pads 522 are placed within a second insulating layer 510 disposed below the first insulating layer 535 such that at least a portion of the top surface of the second insulating layer 510 adjoins a portion of the bottom surface of the first insulating layer 535. Preferably, the multiple metal pads 522 are contained within the pad area to reduce the area from which further metal wiring needs to be excluded. Optionally, metal fills 521 may be placed under the bond pad extension 551. Preferably, the multiple metal pads 522 are copper alloys. Most preferably, the multiple metal pads 522 contain a liner material and copper.

Furthermore, the location of the multiple first metal vias 552 is limited in the first embodiment of the present invention. To qualify this limitation some definitions are presented below:

The center point 555 of the first metal pad 550 is defined as follows. For each of the points within the top surface of the first metal pad, the maximum distance to the periphery of the first metal pad is measured. In other words, each point within the first metal pad is assigned a number which corresponds to the maximum distance to the periphery, or the boundary, of the first metal pad 550. The point that achieves the minimum number among all the numbers assigned to the points within the first metal pad is defined as the center point 555 of the first metal pad 550.

To define a boundary 557, each point on the periphery of the bond pad 550 is hypothetically connected by a straight line to the center point 555. At a fixed percentage of the distance between 15% and 85% measured from the center point 555, each of the hypothetical straight lines is terminated. The set of all the terminated points define the boundary 557.

The pad area of the first metal pad 550 is divided into two areas, a peripheral area 559 located between the periphery of the bond pad 550 and the boundary 557, and a center area 558 confined within the boundary 557. While in all passages below, whenever the peripheral area is described as "an area inside and along edges of said first metal pad" or in similar wordings, the rigorous definition as described above applies. While different percentage numbers may be selected to define a boundary 557 for a given metal pad 550, that is, any percentage between 15% and 85%, one boundary has one number for the selected percentage.

According to the first embodiment of the present invention, the center area 558 does not contain any second metal pad 522. All the metal pads are confined within the peripheral area 559. Consequently, all of the first metal vias 552 are also located within the peripheral area 559.

The first bond pad structure 500 according to the first embodiment of the present invention may further contain a passivation layer 560, which is disposed on the first metal pad 550, the bond pad extension 551, and the first insulating layer 535. The passivation layer 560 blocks the ingress of moisture from the ambient environment into the integrated semiconductor elements below the first bond pad structure 500. Preferably, the passivation layer 560 comprises a silicon nitride or a stack of dielectric material containing silicon nitride, such as a stack of silicon nitride and silicon oxide. Furthermore, a photosensitive polyimide (PSPI) 570 may be disposed on the passivation layer 560. Alternatively, a different material that can be lithographically patterned and conducive to the bonding process may be utilized.

The first bond pad structure 500 according to the first embodiment of the present invention may further contain an opening 561 through both the passivation layer 560 and the PSPI 570. Also, it may contain a barrier layer material 580 with the periphery 581 and disposed on top of the first metal pad 550 within the area of the opening 561. A solder ball 590 may be placed on the barrier layer material 580.

The second metal pads 522 have bottom surfaces, sidewall surfaces, and top surfaces that are not covered by the multiple first metal vias 552. This increases the area of the interface between the first bond pad structure 500 and the surrounding insulating material. Furthermore, the bottom surfaces and the sidewall surfaces of the second metal pads 522 may have a liner material with good adhesion to the insulating material, as is typically the case in typical semiconductor processing flow. Therefore, the adhesion of the first bond pad structure 500 is significantly higher than that from the bond pad structure 100 in FIGS. 1-2 known in the prior art, resulting in higher mechanical strength and improved reliability of the structure under stress.

Typical bond pads are made of an aluminum alloy while most of metal wiring within the back end of the line dielectric stack utilizes copper. The higher adhesion strength between copper and dielectric material than that between the aluminum alloy and dielectric material is utilized in the bond pad structure according to the present invention.

While the area of adhesion is significantly increased, a substantial portion of the area in the metal levels below the bond pad itself is still available for metal wiring. While the flexibility of metal wiring is less than that of a prior art bond pad structure without any vias below the bond pad and thus has maximal available wiring pace under the bond pad, considering that such a structure is prone to reliability issues, a moderate decrease in the flexibility of metal wiring is a fully warranted tradeoff in engineering. The advantage of the structure according to the present invention in maintaining good flexibility in wiring is apparent in comparison with other prior art structures.

Figure 7:
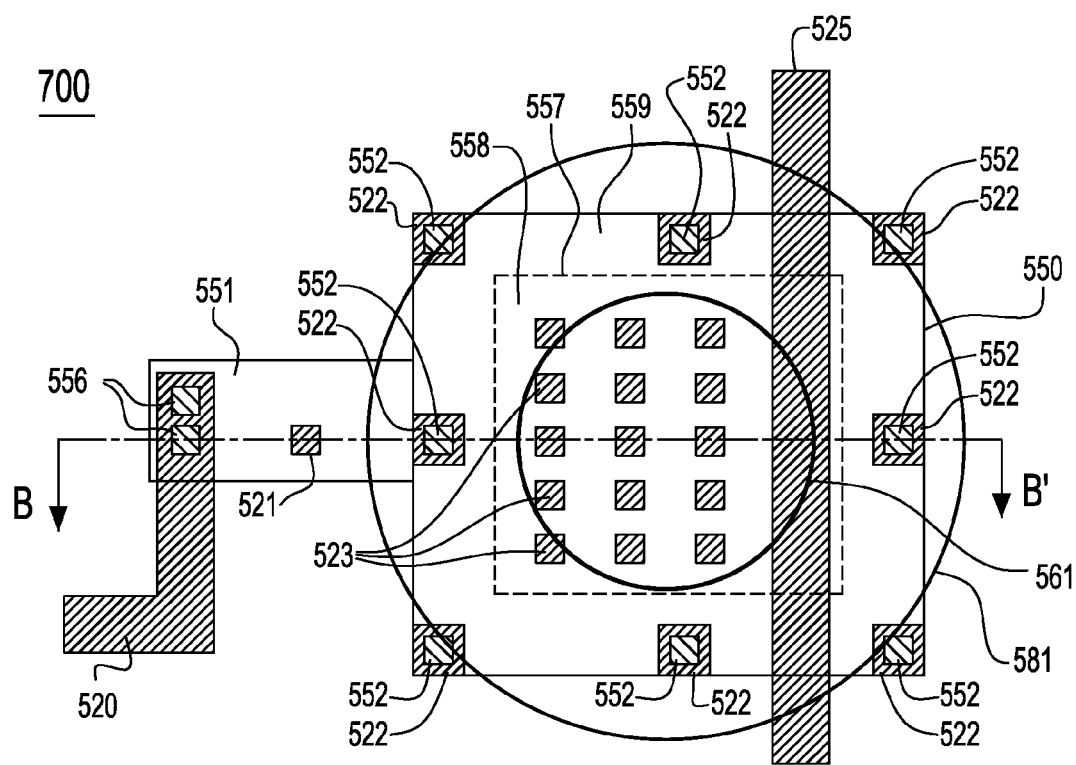
FIG. 7 is a schematic diagram of a top-down view of a bond pad structure according to a second embodiment of the present invention.
Figure 8:
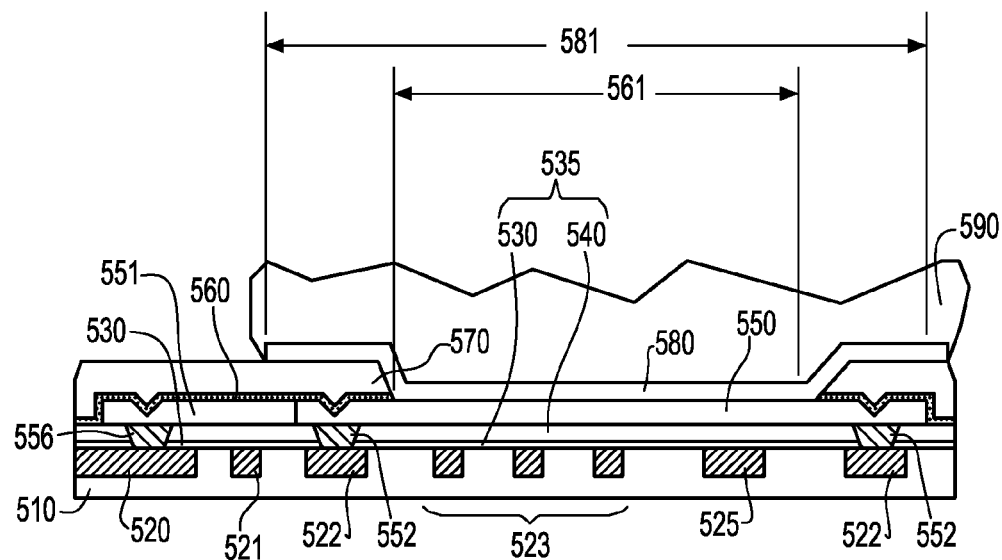
FIG. 8 is a schematic diagram of a cross-sectional view of a bond pad structure in FIG. 7 in the direction B-B'.

According to the second embodiment of the present invention, a second bond pad structure 700 is described in FIGS. 7-8. FIG. 7 is a schematic top-down view, while FIG. 8 is a schematic cross-sectional view along the line B-B' in FIG. 7. The second bond pad structure 700 according to the second embodiment of the present invention is similar to the first bond pad structure 500 according to the first embodiment of the present invention and shares many of the same features. Consequently, like elements between the first and the second embodiments of the present invention are numbered the same. Furthermore, in all of the additional embodiments to be described below, like elements between the described embodiment of the present invention and the first embodiment of the present invention share the same numbers in figures.

According to the second embodiment of the present invention, the center area 558 of the bond pad structure 700 does not contain any second metal pad 522. All the metal pads are confined within the peripheral area 559. All of the first metal vias 552 are also located within the peripheral area 559. Furthermore, at least one metal structure that does not contact any of the first metal vias 552 is placed within the pad area and at the same level as the second metal pads 522. The metal structure can be either first metal fills 523 or at least one first metal wire 525. None of the first metal fills 523 or any of a portion of the first metal wires 525 is adjoined by any of the first metal vias 552. In other words, there are no metal vias within the pad area that connect any of the metal fills 23 or any of a portion of the first metal wires 525 to the first metal pad 550 above.

Any of the first metal wires 525 may extend outside the pad area to make electrical connections to other components of the integrated circuit as necessary. The first metal wires 525 may be utilized to make electrical connections to various parts of the integrated circuit elements or to any other pad other than the bond pad 550, or even to the bond pad 550 through secondary connections. However, there is no first metal via 552 that connects the bond pad 550 and any of the first metal wires 525 directly.

The second embodiment of the present invention enables the placement of first metal wires 525 under the first metal pad 550, or the bond pad, to utilize the area for increased flexibility in wiring during the circuit layout compared to the first embodiment of the present invention. The unused areas after the placement of a portion of the first metal wires 525 are filled with first metal fills 523.

Figure 9:
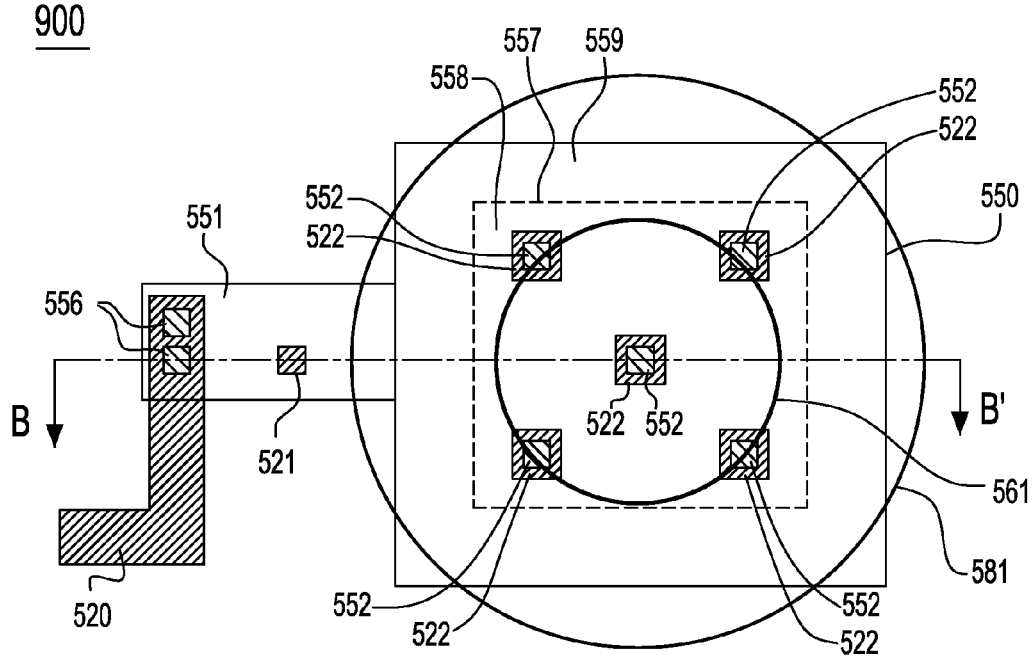
FIG. 9 is a schematic diagram of a top-down view of a bond pad structure according to a third embodiment of the present invention.
Figure 10:
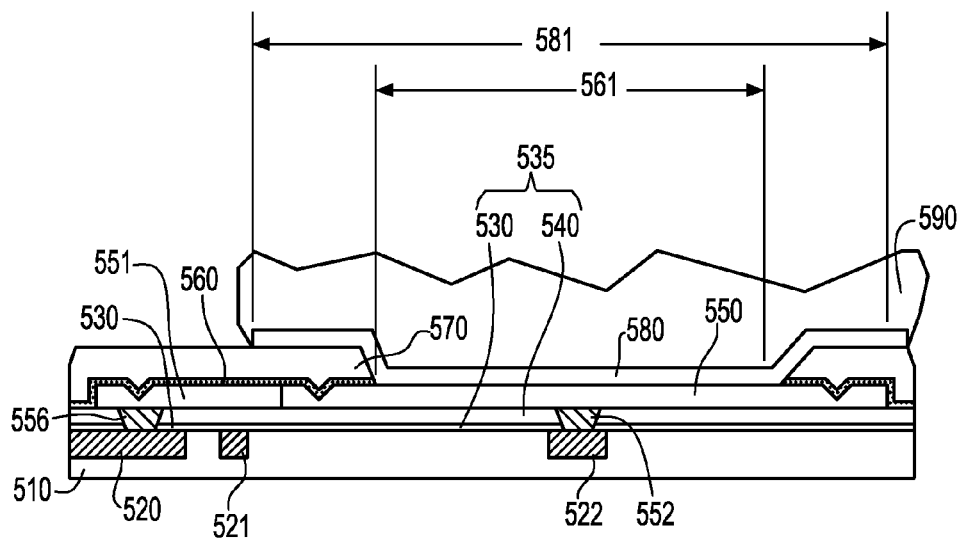
FIG. 10 is a schematic diagram of a cross-sectional view of a bond pad structure in FIG. 9 in the direction B-B'.

According to a third embodiment of the present invention, a third bond pad structure 900 is described in FIGS. 9-10. FIG. 9 is a schematic top-down view, while FIG. 10 is a schematic cross-sectional view along the line B-B' in FIG. 9. The second bond pad structure 900 according to the third embodiment of the present invention is similar to the first bond pad structure 500 according to the first embodiment of the present invention.

According to the third embodiment of the present invention, the peripheral area 559 of the bond pad structure 900 does not contain any second metal pad 522. All the metal pads are confined within the center area 558. Consequently, all of the first metal vias 552 are also located within the center area 559. The third embodiment of the present invention shares the advantages of the first embodiment of the present invention with the difference being that the area that may be utilized for other purposes within the pad area and at the same level as the second metal pads 522 coincide with the peripheral area 559 instead of the center area 558.

According to a fourth embodiment (not shown in figures) of the present invention, a fourth bond pad structure is derived from the third bond pad structure 900 in FIG. 9. All structural features according to the third embodiment of the present invention are also present in the fourth embodiment of the present invention as well. The additional features of the fourth embodiment compared to the features of the third embodiment are similar to the additional features of the second embodiment compared to the features of the first embodiment. For this reason, elements in FIGS. 7-8 are used in this passage to describe the additional features of the fourth embodiment compared to the third embodiment of the present invention. According to the fourth embodiment of the present invention, at least one metal structure that does not contact any of the first metal vias 552 is placed within the pad area and at the same level as the second metal pads 522. The metal structure can be either first metal fills 523 or at least one first metal wire 525. None of the first metal fills 523, nor any of a portion of the first metal wires 525 are adjoined by any of the first metal vias 552. In other words, there are no metal vias within the pad area that connect any of the metal fills 23 or any of a portion of the first metal wires 525 to the first metal pad 550 above.

The fourth embodiment of the present invention enables the placement of first metal wires 525 under the first metal pad 550, or the bond pad, to utilize the area for increased flexibility in wiring during the circuit layout compared to the first embodiment of the present invention. The unused areas after the placement of a portion of the first metal wires 525 are filled with first metal fills 523. The difference between the fourth embodiment and the second embodiment of the present invention is whether the peripheral area 559 or the center area 558 is used for the placement of the second metal pads 552.

Figure 11:
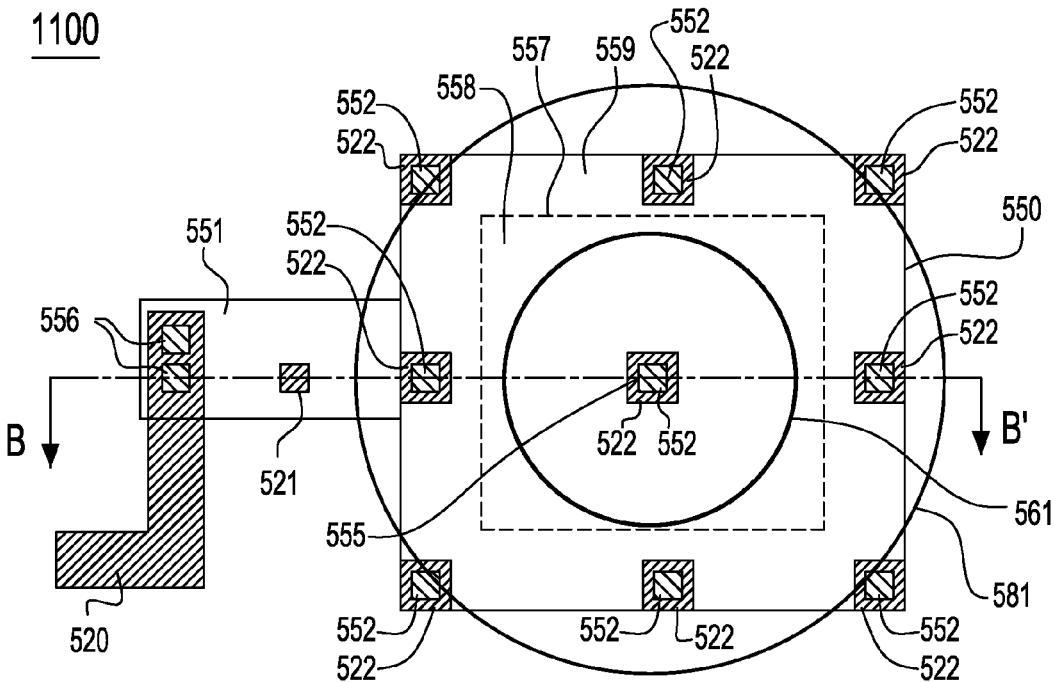
FIG. 11 is a schematic diagram of a top-down view of a bond pad structure according to a fifth embodiment of the present invention.
Figure 12:
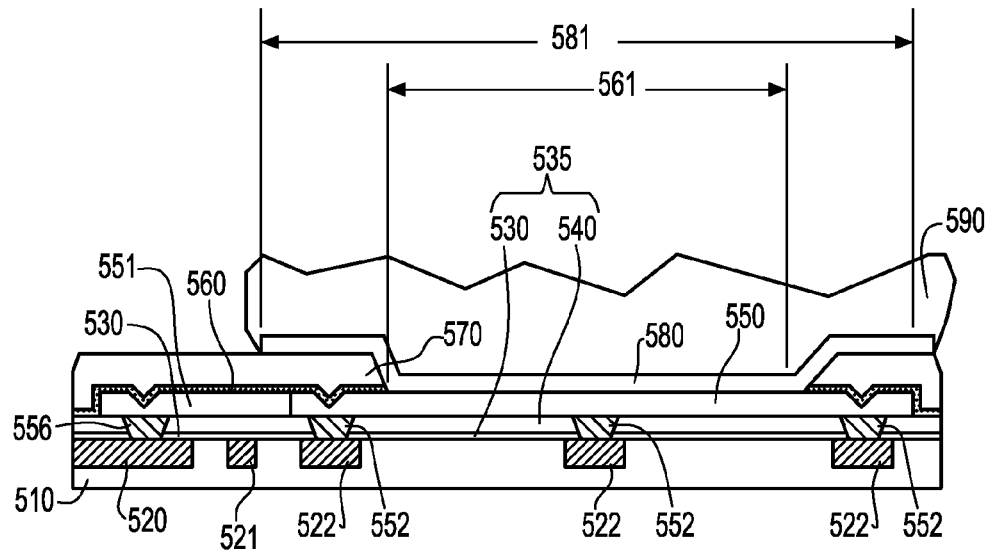
FIG. 12 is a schematic diagram of a cross-sectional view of a bond pad structure in FIG. 11 in the direction B-B'.

According to a fifth embodiment of the present invention, a fifth bond pad structure 1100 is described in FIGS. 11-12. FIG. 11 is a schematic top-down view, while FIG. 12 is a schematic cross-sectional view along the line B-B' in FIG. 11. The fifth bond pad structure 1100 according to the third embodiment of the present invention is similar to the first bond pad structure 500 according to the first embodiment of the present invention except that both the center area 558 and the peripheral area 559 are used for the placement of the second metal pads 552 in the fifth embodiment while only the peripheral area 559 is utilized for the placement of the second metal pads 552 in the first embodiment of the present invention. The fifth embodiment of the present invention enables an increase in the mechanical strength of the bond pad structure 1100 at the expense of flexibility in metal wiring in the same level as the second metal pads 522 compared to the first embodiment.

According to a sixth embodiment (not shown in figures) of the present invention, a sixth bond pad structure is derived from the fifth bond pad structure 1100 in FIG. 11. All structural features according to the fifth embodiment of the present invention are also present in the sixth embodiment of the present invention as well. As in the description of the fourth embodiment of the present invention above, elements in FIGS. 7-8 are used in this passage. According to the sixth embodiment of the present invention, at least one metal structure that does not contact any of the first metal vias 552 is placed within the pad area and at the same level as the second metal pads 522. The metal structure can be either first metal fills 523 or at least one first metal wire 525. None of the first metal fills 523, nor any of a portion of the first metal wires 525 are adjoined by any of the first metal vias 552. In other words, there are no metal vias within the pad area that connect any of the metal fills 23 or any of a portion of the first metal wires 525 to the first metal pad 550 above.

The sixth embodiment of the present invention enables the placement of at least one first metal wire 525 under the first metal pad 550, or the bond pad, to utilize the area for increased flexibility in wiring during the circuit layout. The unused areas after the placement of a portion of the first metal wires 525 are filled with first metal fills 523. The difference between the sixth embodiment and the second or fourth embodiment of the present invention is whether both the peripheral area 559 and the center area 558 are used for the placement of the second metal pads 552 or only one of the two areas is used for the same purposes.

Figure 13:
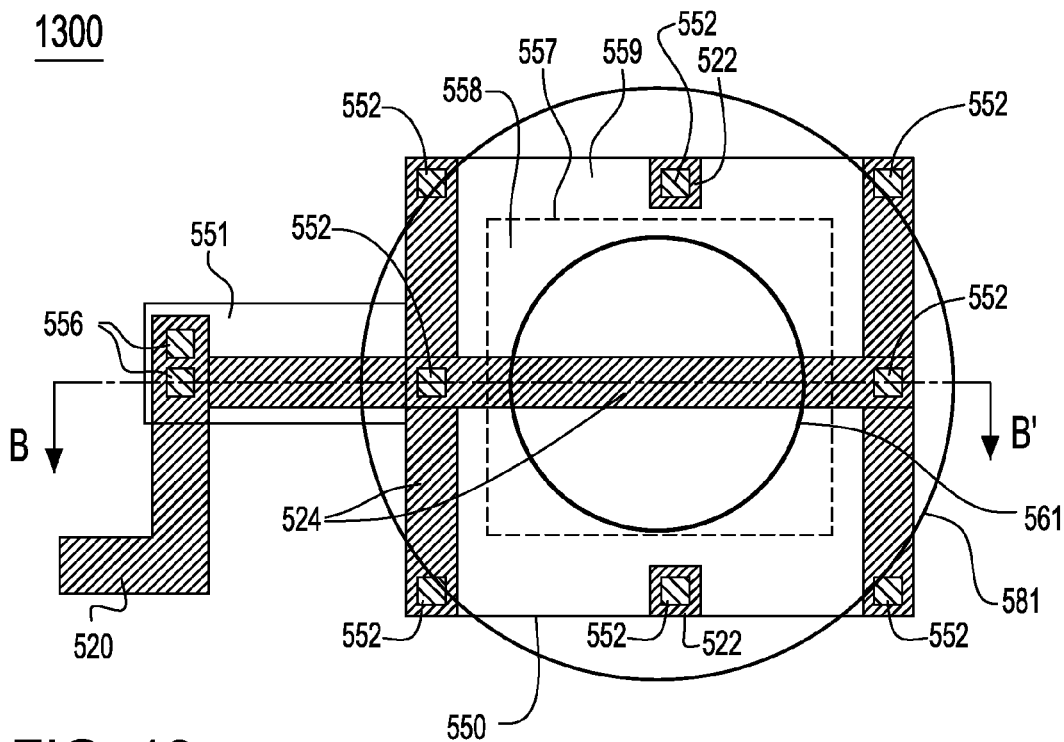
FIG. 13 is a schematic diagram of a top-down view of a bond pad structure according to a seventh embodiment of the present invention.
Figure 14:
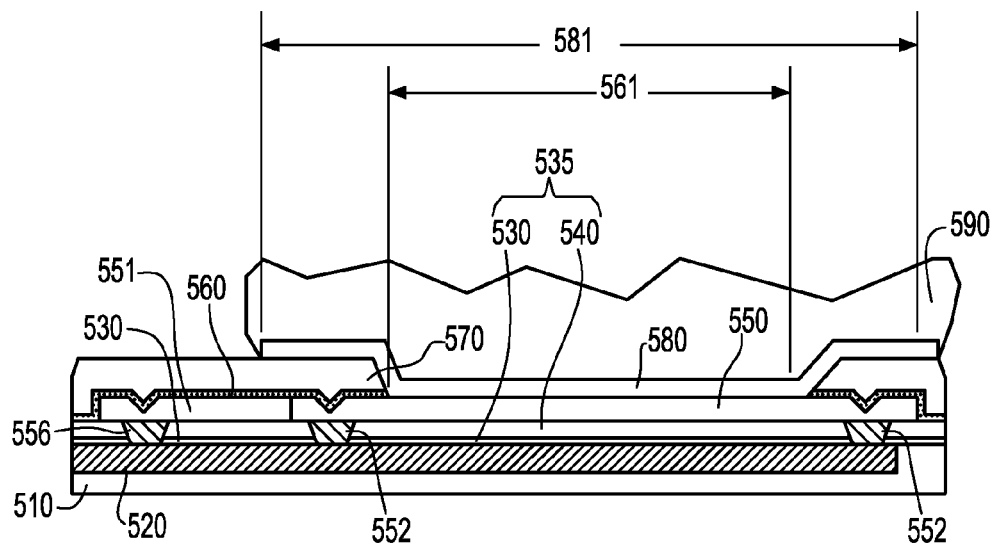
FIG. 14 is a schematic diagram of a cross-sectional view of a bond pad structure in FIG. 13 in the direction B-B'.

According to a seventh embodiment of the present invention, a seventh bond pad structure 1300 is described in FIGS. 13-14. FIG. 13 is a schematic top-down view, while FIG. 14 is a schematic cross-sectional view along the line B-B' in FIG.

13. The seventh bond pad structure 1300 according to the seventh embodiment of the present invention shares all the elements of the first bond pad structure 500 according to the first embodiment of the present invention described above. In addition, at least one second metal wire 524 is placed within the pad area and at the same level as the second metal pads 522. Any of the second metal wires 524 may extend outside the pad area to make electrical connections to other components of the integrated circuit as necessary. All of the second metal wires 524 is adjoined by at east one of the first metal vias 552 and electrically connected to the bond pad 550.

The seventh embodiment of the present invention enables the use of the pad area at the same level as the second metal pads for wiring the bond pad 550 to the integrated circuit elements below. Alternatively, the second metal wires 524 may be used with existing wiring scheme to reduce the resistance of the circuit wiring path from the bond pad 550.

Figure 15:
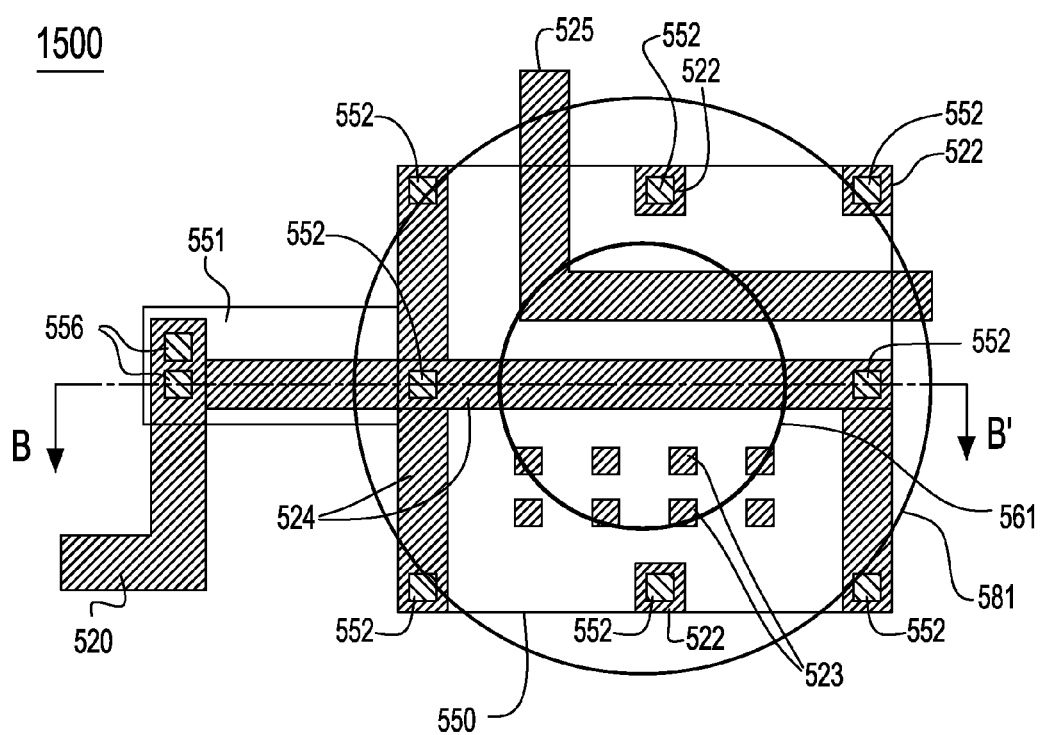
FIG. 15 is a schematic diagram of a top-down view of a bond pad structure according to an eighth embodiment of the present invention.

According to an eighth embodiment of the present invention, an eighth bond pad structure 1500 is described in a schematic top-down view in FIG. 15. The eighth bond pad structure 1500 according to the present invention shares all the elements of the seventh bond pad structure 1300 according to the seventh embodiment. Furthermore, at least one metal structure that does not contact any of the first metal vias 552 is placed within the pad area and at the same level as the second metal pads 522. The metal structure can be either first metal fills 523 or at least one first metal wire 525. None of the first metal fills 523, nor any of a portion of the first metal wires 525 are adjoined by any of the first metal vias 552. In other words, there are no metal vias within the pad area that connect any of the metal fills 23 or any of a portion of the first metal wires 525 to the first metal pad 550 above. The structure and the functionality of the first metal wires 525 is exactly the same as described in any of the prior embodiments of the present invention.

The eighth embodiment of the present invention enables the placement of first metal wires 525 under the first metal pad 550, or the bond pad, to utilize the area for increased flexibility in wiring during the circuit layout compared to the seventh embodiment of the present invention. The unused areas after the placement of a portion of the first metal wires 525 are filled with first metal fills 523.

Figure 16:
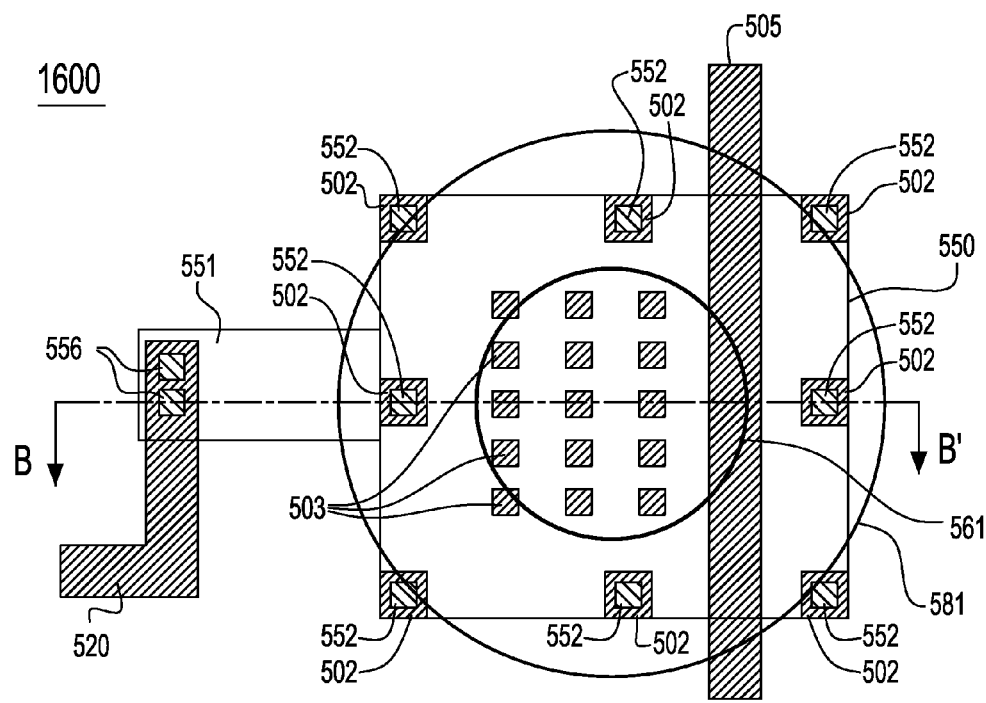
FIG. 16 is a schematic diagram of a top-down view of a bond pad structure according to a ninth embodiment of the present invention.

Table 1 below shows a list of enabled elements according to the first through eighth embodiments of the present invention in a tabular format.

schematic cross-sectional view along the line B-B' in FIG. 16. Since all elements common with the other embodiments of the present invention are labeled with the same reference number and have the same structural and functional characteristics, only the key elements of the ninth embodiment of the present invention are described herein.

The first bond pad structure 500 has a first metal pad 550 and a first insulating layer 535. Multiple first metal vias 552 through the first insulating layer 535 are located within the pad area wherein the top surface of each of the multiple first metal vias 552 adjoins a portion of the bottom surface of the first metal pad 550, or the bond pad.

According to the ninth embodiment of the present invention, multiple third metal pads 502 and multiple second metal vias 507 are provided. Each of the third metal pads 502 may be placed in any metal level below the level of the first metal pad 550. The distinction between third metal pads 502 and second metal pads 522 is made herein to point out that the third metal pads may be placed in any metal level below the level of the first metal pad 550 whereas the second metal pads 522 can be placed only in the metal level immediately below the level of the first metal pad 550. Also, each of the second metal vias 505 may be placed between any two metal levels or even between a metal level and the semiconductor substrate.

However, each of the third metal pads 502 and each of the second metal vias is a part of one of the many vertical alternating stacks 595, which is formed alternately adjoining third metal pads and second metal vias vertically such that the component for the top of each vertical alternating stack 595 is one of the third metal pads 502. In other words, a vertical alternating stack comprises at least one of third metal pads 502 and at least one of second metal vias 507. The stacking sequence of each of the vertical alternating stacks, counted from the top to bottom, begins with a third metal pad 502, followed by a second metal via 507, and alternates between one of the third metal pads 502 and one of the second metal vias 507 if more components are used. If the components of the alternating vertical stacks are listed from top to bottom, for example, an alternating vertical stack may consist of a third metal pad 502 and a second metal via 507, a third metal pad 502 and a second metal via 507 and another third metal pad 502, a third metal pad 502 and a second metal via 507 and another third metal pad 502 and another third metal via 507, a third metal pad 502 and a second metal via 507 and another third metal pad 502 and another second metal via 507 yet

TABLE 1

List of enabled elements according to the first through eighth embodiments of the present invention

| Enabled elements | First metal vias in center area 558 | First metal vias in peripheral area 559 | First metal fills 523 | First metal wires 525 | Second metal wires 524 |
|---|---|---|---|---|---|
| First embodiment | No | Yes | No | No | No |
| Second embodiment | No | Yes | Yes | Yes | No |
| Third embodiment | Yes | No | No | No | No |
| Fourth embodiment | Yes | No | Yes | Yes | No |
| Fifth embodiment | Yes | Yes | No | No | No |
| Sixth embodiment | Yes | Yes | Yes | Yes | No |
| Seventh embodiment | No | Yes | No | No | Yes |
| Eighth embodiment | No | Yes | Yes | Yes | Yes |

Figure 17:
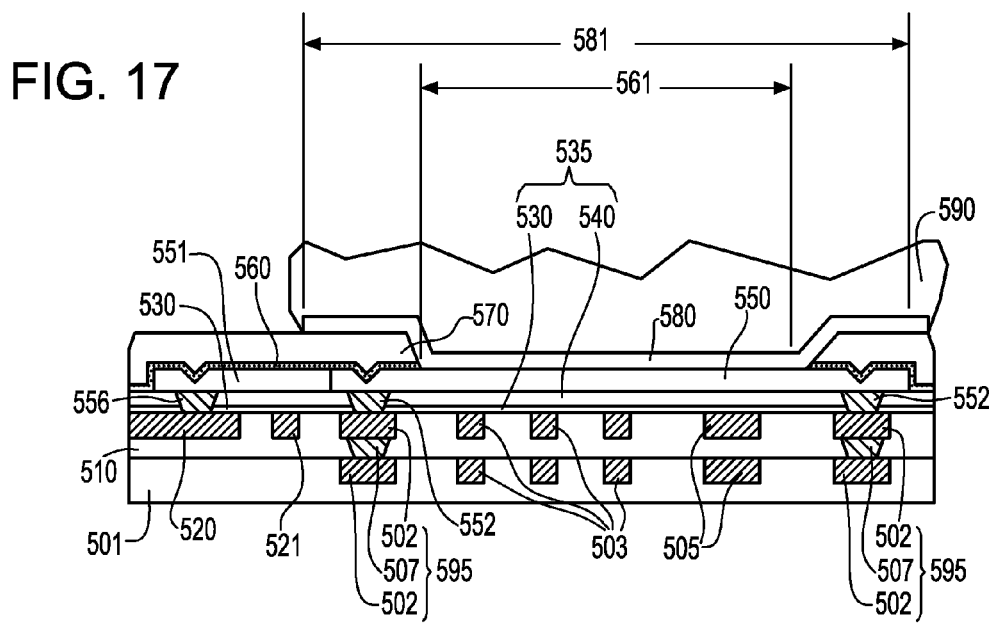
FIG. 17 is a schematic diagram of a cross-sectional view of a bond pad structure in FIG. 13 in the direction B-B'.

According to a ninth embodiment of the present invention, a ninth bond pad structure 1600 is described in FIGS. 16-17. FIG. 16 is a schematic top-down view, while FIG. 17 is a another third metal pad, etc. The bottom of a sequence may terminate with a third metal pad 502 or a second metal via 507. The bottom of a vertical alternating stack may terminate within a layer of back end of the line dielectric material, a shallow trench isolation, or the semiconductor substrate.

Optionally, at least one metal structure that does not contact any of the multiple metal vias 552 or any of the vertical alternating stacks 595 is placed within the pad area and at any level wherein any of the third metal pads 502 are located. The metal structure can be either second metal fills 503 or at least one third metal wire 505. Once again, a distinction between embodiments of the present invention is made in that second metal fills and third metal wires in the ninth embodiment may be placed at any level wherein any of the third metal pads 502 are located whereas first metal fills and first metal wires in the prior embodiments can be placed only in the metal level immediately below the level of the first metal pad 550. None of the second metal fills 503, or any of a portion of the third metal wires 505 is adjoined by any of the first metal vias 552 or by any of the alternating vertical stacks 595. In other words, there is no electrical connection between the bond pad 550 and either the second metal fills 503 or third metal wires 505.

Any of the third metal wires 505 may extend outside the pad area to make electrical connections to other components of the integrated circuit as necessary. The third metal wires 505 may be utilized to make electrical connections to various parts of the integrated circuit elements or to any other pad other than the bond pad 550, or even to the bond pad 550 through secondary connections. However, there is no first metal via 522 that connects the bond pad 550 and any of the first metal wires 505 directly.

Also, optionally, at least one fourth metal wire (not shown in FIGS. 16-17) may be placed within the pad area and at the same level as any of the third metal pads 522. Both structurally and functionally, the fourth metal wires are similar to the second metal wires 524 as described in the bond pad structure 1300 according to the seventh embodiment of the present invention in FIGS. 13-14. However, the fourth metal wires according to the ninth embodiment of the present invention may be placed in any level containing at least one of the third metal pads 522 whereas the second metal wires according to the seventh and eighth embodiments of the present invention limits the placement of the second metal wires to the metal level immediately below the level of the first metal pad 550. Any of the fourth metal wires may extend outside the pad area to make electrical connections to other components of the integrated circuit as necessary. All of the fourth metal wires are directly or indirectly adjoined by at east one of the first metal vias 552 and electrically connected to the bond pad 550.

A method of fabricating the bond pad structures in the various embodiments described above is now discussed.

Integrated circuit devices are first formed on a semiconductor substrate. A back end of the line stack is formed layer by layer above the integrated circuit devices by depositing insulator layers, etching of lines and vias in the insulator layers, filling the metal lines and vias with metal, and removing the excessive metal outside the metal lines and planarizing the surface for each layer of processing.

In the case of the ninth embodiment according to the present invention, the vertical alternating stacks 595 are formed within the back end of the line stack by forming third metal pads 502 in appropriate metal layers at the same time and using identical processing methods as when the metal wires in the same level are formed. Similarly, second metal vias 507 are formed at the same time and using identical processing methods as when other vias in the same level are formed. Proceeding in this manner, all components of the vertical alternating stacks 595 located below the second insulating layer 510 in the bond pad structure 1600 in FIGS. 16-17 are formed.

For all embodiments of the present invention, a second insulating layer 510 is deposited over an underlying region of semiconductor device at this point. The underlying region may have a back end of the line stack, which in turn may comprise multiple insulator layers, metal line levels, and via levels as is necessary for the implementation of the ninth embodiment of the present invention as described above. The second metal pads 522, any of the first metal fills 523, any first metal wires 525, and any second metal wires 524 according to the first through eighth embodiment of the present invention are lithographically patterned on the second insulating layer 510 by depositing a layer of photoresist, exposing it under a mask to a light source, and developing it. Alternatively, third metal pads 502 and any of the second metal fills 503, third metal wires 505, and fourth metal wires that are located within the bond pad structure 1600 in FIGS. 16-17 according to the ninth embodiment of the present invention are lithographically patterned on the second insulating layer 510 in a similar manner. The lithographic pattern is then etched into the second insulating layer 510 by a reactive ion etch (RIE) process.

Vias located within the second insulating layer 510 are formed by lithographically patterning the vias followed by an etch process that transfers the pattern into the second insulating layer 510. Patterning and etching of the vias may be performed prior to or after the etching of the pattern for the second metal pads 522 or the third metal pads 502 that are located within the second insulating layer 510. In the ninth embodiment of the present invention, the second metal vias 507 that are located within the second insulating layer 510 are formed at the same time as the other vias located within the same level.

All the features in the metal level within the second insulating layer 510 are filled with a first conducting material. Specifically, according to the first through eighth embodiments of the present invention, the second metal pads 522, any of the first metal fills 523, any first metal wires 525, and any second metal wires 524 are filled with the first conducting material. Alternatively, according to the ninth embodiment of the present invention, the third metal pads 502 and any of the second metal fills 503, third metal wires 505, and fourth metal wires that are located within the bond pad structure 1600 in FIGS. 16-17 are filled with the first conducting material. The first conducting metal is preferably a stack of a liner material and a metal layer. Most preferably, the metal layer is made of copper. Preferably, the fill process fills both the metal lines and the metal vias at the same time, which is called a dual damascene process.

Any excess first conducting material above the top surface of the second insulating layer 510 is then removed by a chemical mechanical polish (CMP) process.

While the process for the manufacture of the structures within the second insulating layer 510 is described with a dual damascene process whether the metal lines be formed first or the vias be formed first, the same structures may alternatively be fabricated using a single damascene process, wherein the features in the via levels are produced first and the features in the metal line level are produced thereafter. This invention may be practiced both ways.

Thereafter, a first insulating layer 535 is deposited over the second insulating layer 510 and the metal structures filled with the first conducting material. Preferably, the first insulating layer 535 comprises a stack of a cap layer 530, which is deposited first, and an insulating dielectric layer 540, which is deposited after and on top of the cap layer 530.

Another layer of photoresist is deposited over the first insulating layer 535, exposed to a light source under a mask, and developed such that a pattern of multiple first metal vias 552 are formed on the photoresist. The pattern includes the features for first metal vias 552. This pattern is etched into the first insulating layer 535 using a RIE process. The patterned part of the first insulating layer 535 is etched through and portions of the top surface of the metal structures are exposed. The resulting structure includes openings for the formation of the first metal vias 552. Specifically, the exposed metal surfaces are those of the second metal pads 552 and any of the second metal wires 524 in the seventh or eighth embodiment of the present invention or those of the third metal pads 552 within the level of the second insulating layer 510 and any of the fourth metal wires in the ninth embodiment of the present invention.

Thereafter, a metal layer made of a second conducting material is deposited over the first insulating layer and inside the openings. Preferably, the second conducting material is an aluminum alloy. Most preferably, the second conducting material is a stack containing a liner material and aluminum. This deposition process forms a blanket film, which includes the first metal pad 550, the first metal vias 552, and an optional bond pad extension 551 as well as unwanted portions of the second conducting material elsewhere.

A third pattern containing a pattern for the first metal pad 550 and optionally, the bond pad extension 551 is formed by depositing yet another layer of photoresist, and exposing it to a light source under a mask containing the features for the first metal pad 550 and optional bond pad extension 551. The unwanted portions of the second conducting material that are located outside the area of the first metal pad 550 and outside the area of the bond pad extension 551, if any of the bond pad extension 551 is present, is then etched and removed. Thus, the shape of the first metal pad 550, or a bond pad, is defined at this point.

Thereafter, a passivation layer 560 is deposited over the first metal pad 550 and over the second insulating layer 535, followed by a deposition of a photosensitive polyimide layer 570 over the passivation layer 560. The photosensitive polyimide layer 570 is then exposed to a light source under a mask that contains a pattern for an opening 561 over the first metal pad 550. A portion of the passivation layer 560 and the photosensitive polyimide layer 570 is then removed from above the first metal pad 550 from within the area of the opening 561. The opening 561 within the passivation layer 560 and the photosensitive polyimide layer 570 is smaller than the size of the first metal pad 550.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of forming a bond pad structure for an integrated circuit, comprising the steps of:
    depositing a first insulating layer over an underlying region of semiconductor device;
    lithographically forming a first pattern of multiple first pads on said first insulating layer;
    etching said first pattern of said multiple first pads from said first insulating layer;
    filling said etched first pattern of said multiple pads with a first conducting material;
    removing a first conducting material from above an upper surface of said first insulating layer;
    depositing a second insulating layer over said first insulating layer and over said first conducting material;
    lithographically forming a second pattern of multiple vias on said second insulating layer, wherein each of said multiple vias is located within one of said multiple first pads;
    etching said second pattern of said multiple vias into said second insulating layer;
    exposing a first conducting material from under each of said etched second pattern;
    filling said etched second pattern of said multiple vias with a second conducting material;
    lithographically forming a third pattern of a first metal pad over said multiple vias, wherein all of said multiple vias are within the shape of said first metal pad; and
    etching said second conducting material from outside the area of said first metal pad.

2. The method of claim 1, further comprising
    lithographically forming a fourth pattern of multiple first fills on said first insulating layer while lithographically forming a first pattern of multiple first pads on said first insulating layer,
    wherein none of said multiple vias is located within one of said multiple first pads;
    etching said fourth pattern of said multiple first fills from said first insulating layer while etching said first pattern of said multiple first pads from said first insulating layer; and
    filling said etched fourth pattern of said multiple fills with a first conducting material while filling said etched first pattern of said multiple pads with a first conducting material.

3. The method of claim 1, further comprising, after etching said second conducting material from outside the area of said first metal pad,
    depositing a passivation layer over said first metal pad and over said second insulating layer;
    depositing a photosensitive polyimide layer over said passivation layer; and
    removing a portion of said passivation layer and said photosensitive polyimide layer from above said first metal pad.

4. The method of claim 1, wherein removing of said first conducting material from above said upper surface of said first insulating layer is done through chemical mechanical polishing (CMP).

5. The method of claim 1, further comprising said second insulating layer comprises a stack of a cap layer and an insulating layer.

6. The method of claim 1, wherein said first conducting material is copper and said second conducting material is an aluminum alloy.

* * * * *